United States Patent [19]

Svendsen

[11] 4,423,383

[45] Dec. 27, 1983

[54] PROGRAMMABLE MULTIPLE FREQUENCY RATIO SYNCHRONOUS CLOCK SIGNAL GENERATOR CIRCUIT AND METHOD

[75] Inventor: Gordon D. Svendsen, Belmont, Calif.

[73] Assignee: Ampex Corporation, Redwood City, Calif.

[21] Appl. No.: 355,284

[22] Filed: Mar. 5, 1982

[51] Int. Cl.³ ........................... H03K 5/15; H03L 7/00
[52] U.S. Cl. ......................................... 328/63; 328/60; 328/62; 307/269
[58] Field of Search ....................... 328/63, 60, 61, 62, 328/72; 307/269

[56] References Cited

U.S. PATENT DOCUMENTS

| 3,893,033 | 7/1975 | Finch | 328/63 |
| 4,255,793 | 3/1981 | Nakamura | 328/63 |
| 4,306,190 | 12/1981 | Beckwith et al. | 328/62 |
| 4,379,265 | 4/1983 | Catiller | 328/62 |

Primary Examiner—John S. Heyman
Attorney, Agent, or Firm—Joel D. Talcott; Elizabeth E. Strnad

[57] ABSTRACT

A circuit and method for providing two or more synchronous clock signals whose respective frequency ratios can be readily changed with respect to a master clock signal frequency.

9 Claims, 3 Drawing Figures

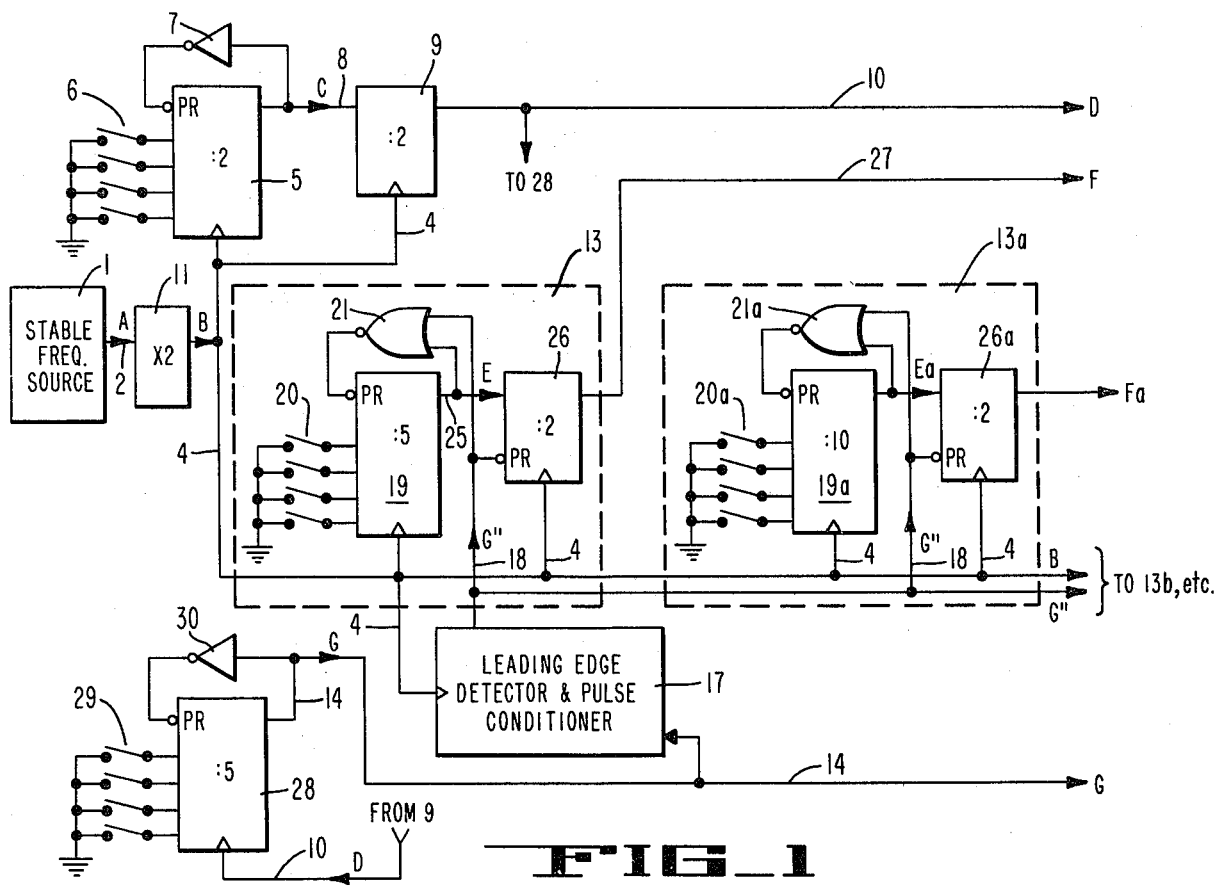
FIG_1
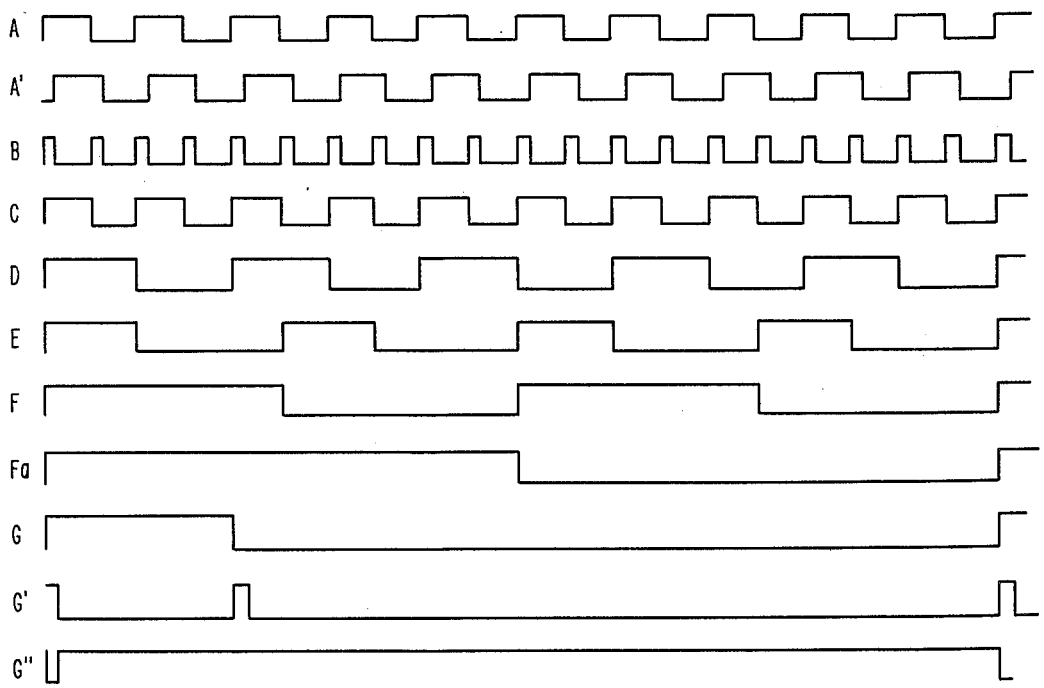
FIG_3

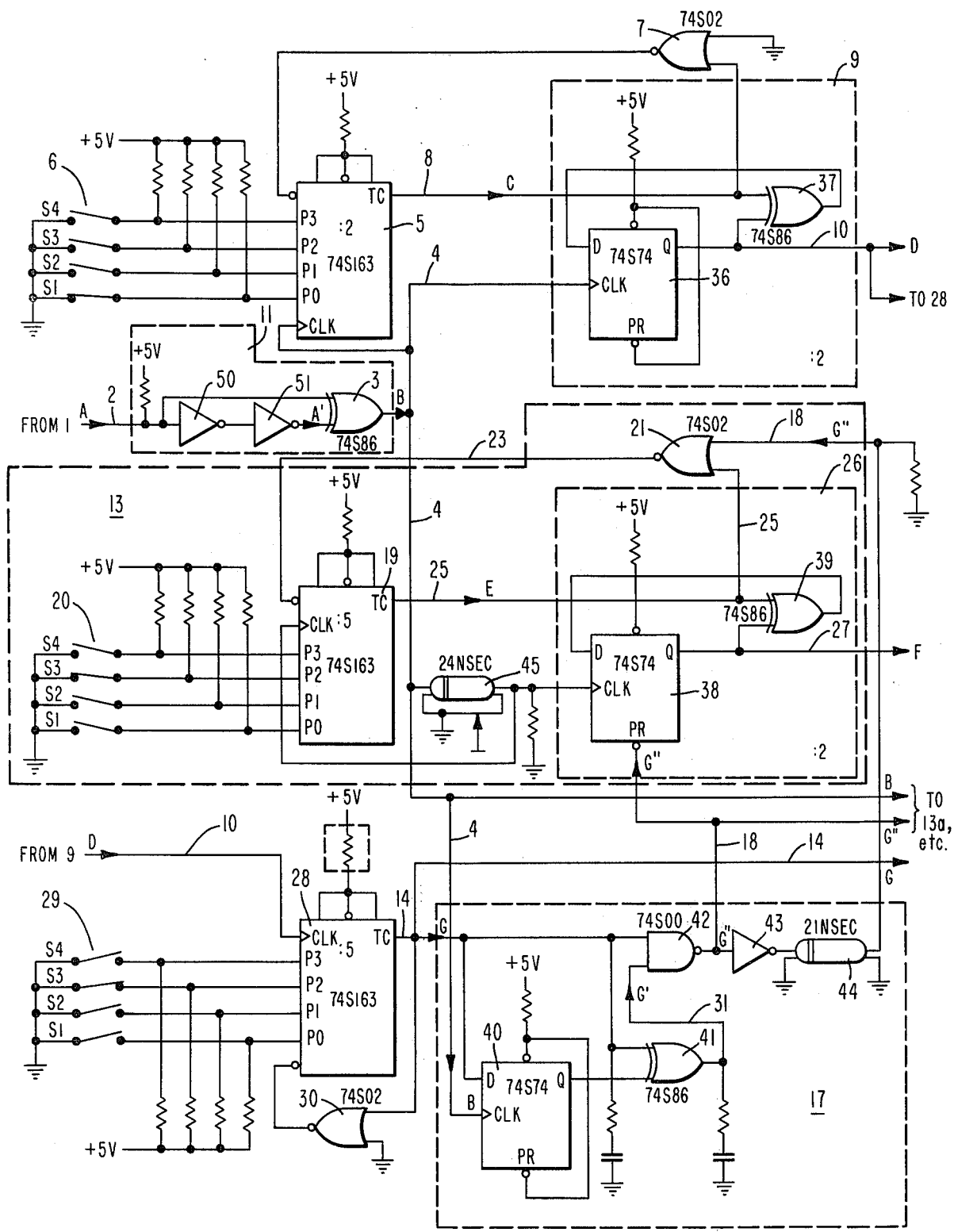
FIG_2

4,423,383

PROGRAMMABLE MULTIPLE FREQUENCY RATIO SYNCHRONOUS CLOCK SIGNAL GENERATOR CIRCUIT AND METHOD

BACKGROUND OF THE INVENTION

The invention is related to a circuit and method for providing synchronous clock signals having respective programmable frequency ratios with respect to a master clock signal frequency.

Systems providing two or more synchronous clock signals having different frequencies are known to utilize a master clock signal generator and respective frequency dividers, each providing a desired frequency division ratio with respect to the master clock signal frequency. A synchronization signal which is necessary to synchronize the various frequency dividers is known to be obtained from an external source. Synchronous clock signals are useful for example in various digital signal transmission systems, in digital data processing systems such as utilizing two or more synchronized serial-to-parallel or parallel-to-serial data converters and in similar applications. The known prior art systems have a disadvantage that when the frequency ratio of one or more clock signals is changed it is necessary to change accordingly the synchronization signal frequency and thus to replace the respective frequency dividers and other circuit components to adapt the circuit to the changed frequency ratio.

SUMMARY OF THE INVENTION

Accordingly, it is an object of the present invention to provide a synchronous clock signal generator circuit and method producing two or more synchronous clock signals having respective programmable frequency ratios with respect to a master clock signal frequency and which circuit does not require the use of an external synchronizing signal.

It is a further object of the invention to provide a synchronous clock signal generator circuit and method in which the respective frequency ratios of the output signals can be readily changed without the need of replacing or modifying circuit components.

It is a still further object of the invention to provide a circuit as above-indicated and which itself generates a synchronizing signal having a programmable frequency ratio with respect to all the output signals provided by the circuit.

BRIEF DESCRIPTION OF THE DRAWINGS

FIG. 1 is a simplified circuit diagram of the preferred embodiment of the invention.

FIG. 2 is a detailed schematic circuit diagram of the preferred embodiment of the invention.

FIG. 3 is a timing diagram showing respective signals occurring at various circuit locations of the preferred embodiment of the invention.

DETAILED DESCRIPTION

The preferred embodiment of the invention will be described now with reference to the simplified circuit diagram of FIG. 1 and related timing diagram of FIG. 3. Thereafter a more detailed description will be given with reference to FIG. 2.

As an example, FIG. 1 shows a circuit for generating synchronous digital clock signals utilizing a stable frequency source 1 for generating a master clock signal such as shown at A in FIG. 3, having a frequency for example of 1 MHz. The frequency source 1 is preferably implemented by a suitable crystal oscillator, for example Model CO-231 manufactured by Vectron Laboratories.

The master clock signal A is applied on line 2 to a frequency multiplier 11, whose multiplication factor is preferably selected to multiply by 2. The frequency multiplied output signal B from multiplier 11 is applied on line 4 as a clock signal to a first presettable frequency divider 5 which is preferably implemented by a free running counter having a division ratio preset by programmable switches 6, for example to divide by 2. Frequency divider 5 resets via inverter 7 connected between its terminal count output and load input. The frequency of output signal C from frequency divider 5 on line 8 is further divided by two in subsequent frequency divider 9, which receives as its clock signal the previously mentioned signal B on line 4. The above-indicated division ratio of divider 9 is selected such that it compensates for the multiplication factor of multiplier 11. Thus the resulting clock signal D obtained on line 10 has its frequency ratio with respect to signal A determined by the preset ratio of divider 5, while the obtained output signal D is synchronous with signal A. As it is seen from the timing diagram of FIG. 3, the output signal D on line 10 is symmetrical.

With further reference to the circuit of FIG. 1 and timing diagram of FIG. 3, the previously described signal B on line 4 is also applied as a clock signal to a second presettable frequency divider 19 preferably implemented by a free running counter whose division ratio is preset by programmable switches 20 for example to divide by five. The output signal E on line 25 from divider 19 is asymmetrical and it is supplied to a further frequency divider 26 where its frequency is divided by two. Divider 26 receives signal B on line 4 as its clock signal and the resulting output signal F therefrom on line 27 is symmetrical and synchronous with signal A. The division ratio of frequency divider 26 is selected such that it compensates for the multiplication factor of frequency multiplier 11 to obtain a resulting clock signal F on line 27 whose frequency ratio with respect to master clock signal A frequency is determined by the division ratio of the second presettable divider 19 preset by switches 20.

It is noted that in applications where output signals D and F are not required to be symmetrical, multiplier 11 and the respective dividers 9 and 26 may be deleted from the circuit.

The second presettable frequency divider 19 is periodically reset via a NOR gate 21 whose one input is coupled to the terminal count output 25 of divider 19 while its other input is coupled to an output line 18 from a leading edge detector and pulse conditioner circuit 17 which circuit will be described later in more detail. The output of NOR gate 21 is connected to the load input of divider 19. Programmable switches 20, the respective dividers 19, 26 and NOR gate 21 together form a presettable frequency divider circuit portion enclosed by interrupted line 13 in FIG. 1. Circuit 17 receives on line 14 an output signal G from a third presettable frequency divider 28 as described below.

The third presettable frequency divider 28 is preset by programmable switches 29 to have a desired division ratio, which in the preferred embodiment is selected as division by five. The latter division ratio is selected such that a resulting output signal G on line 14 has an integral frequency division ratio with respect to the frequencies of both output signals D and F, respectively. Consequently the frequency of the output signal G on line 14 corresponds to a rate of coincidence between the leading edges of signals D and F. Divider 28 is preferably implemented by a free running counter which receives the previously described signal D on line 10 as its clock signal. Frequency divider 28 resets via an inverter 30 coupled between its terminal count output and load input. The resulting output signal G on line 14 is thus synchronized with signal D on line 10 and consequently, also with the master clock signal A.

The leading edge detector and pulse conditioner circuit 17 receives the previously described signal B on line 4 and the signal G on line 14 and it derives from these respective signals a synchronizing output signal G″ on line 18. As it is seen from FIG. 3 and will follow from a more detailed description of circuit 17 with reference to FIG. 2, the frequency ratio of signal G″ with respect to the frequency of signal D is determined by the preset division ratio of the third presettable frequency divider 28. The output signal G″ on line 18 has a pulse width shorter than one-half cycle of the master clock signal A and it is synchronous with signal D and also with the master clock signal A. Signal G″ is utilized both for periodically presetting the second presettable frequency divider 19 and for periodically presetting the divider 26 to assure that the respective output signals E on line 25 and F on line 27 are synchronous with signal G and consequently also with signals D and A.

It is seen from the foregoing description that while the respective presettable frequency dividers 5, 19 and 28 are respectively implemented by free running counters, each counter is preset by a respective programmable switch 6, 20 or 29, to obtain a desired division ratio and it is periodically reset by its own terminal count. Besides that, to assure synchronization between the respective output signals D and F the counter 19 is also preset by the output signal G″ from circuit 17, the latter signal enabling the data representing the preset count on switch 20 to enter into counter 19 in synchronism with the leading edge of signal G″, thus synchronizing signal E thereto. Thus counter 19 is synchronized by signal G″ derived by circuit 17 from output signal G of counter 28, and signal B, while circuit 17 in turn uses the output signal D from counter 9 as its clock signal. In the foregoing manner synchronism of all respective signals A, B, C, D, E, F and G is obtained.

As it has been described above, the division ratio of the third presettable frequency divider 28 determines the frequency of the synchronizing signal G″ which signal is utilized to preset the second presettable frequency divider 19. Consequently it will be further referred to the third presettable frequency divider 28 as the "synchronizing" frequency divider.

While any respective integral division ratio may be selected for the first and second presettable frequency divider 5 and 19 with respect to the master clock signal A frequency, the ratio of the third presettable frequency divider 28 is selected to obtain an integral frequency division ratio with respect to the frequencies of both output signals D and F of FIG. 1. Consequently one cycle of signal G and thus also of signal G″ corresponds to respective integral multiple number of cycles of the respective output signals D and F and thus also of signal A.

Additional synchronous clock signals Fa, Fb, etc. of desired frequency ratios with respect to the master clock signal A frequency may be generated by the circuit of FIG. 1, by additional circuit portions 13a, 13b, etc. each corresponding to the above-described circuit portion 13, one such additional circuit portion 13a being shown in FIG. 1. Each additional circuit portion will receive the respective signals B and G″ as it has been described previously with respect to circuit portion 13 of FIG. 1. The presettable frequency divider 19a of circuit 13a is preset for example to divide by 10 by associated programmable switches 20a. Since circuit 13a, as well as any further additional circuit 13b, etc. (not shown) corresponds to the previously described circuit 13, their description is not repeated herein.

It is noted however with respect to the foregoing description that when utilizing additional circuits 13a, etc., for providing additional synchronous clock signals such as Fa etc., each having a desired preset frequency ratio with respect to the master clock signal A, then the presettable division ratio of the synchronizing frequency divider 28 is selected to provide an output signal G on line 14 having a frequency corresponding to the rate of coincidence of all the respective clock signals D, F, Fa, etc. provided by the circuits of FIG. 1. While any such rate of coincidence may be selected, it is preferable to select the frequency of signal G corresponding to the highest rate of coincidence to obtain the highest possible frequency of the resulting synchronization signal G″ for better synchronization of the system.

As a further example of selecting different frequency division ratios, divider 5 may be preset to divide by 5, divider 19 may be preset to divide by 2, while the "synchronizing" divider 28 may be preset to divider by 2 to obtain an output signal G whose one cycle corresponds to two cycles of signal D, five cycles of signal F and ten cycles of signal A, respectively. Alternatively, divider 28 may be preset to divide by an integral multiple of 2, such as 4, 6, 8, etc., if desired, to obtain lower rates of coincidence and thus respective lower frequencies of signal G with respect to signals A, D and F. It will be understood that the division ratio preset by the respective presettable frequency dividers is theoretically not limited except by the specific counters implementing the respective presettable dividers. In the preferred embodiment the maximum count obtainable by the particular type of presettable counters utilized is 16, however, it may be extended to any higher count, if desired, by connecting two or more counters in series as it is well known in the art.

In a still further example where the frequency of signal A is designated as $f_A$ the frequency of signal D as $f_D$ etc., the various frequency ratios may be selected as:
$f_D = \frac{1}{3} f_A$;
$f_F = \frac{1}{4} f_A$;
$f_{Fa} = 1/5 \ f_A$;
$f_{Fb} = 1/6 \ f_A$;
then $f_G$ may be selected as
$f_G = 1/60 \ f_A$;
or
$f_G = 1/120 \ f_A$, etc.

Consequently, divider 5 would be set to divide by 3; divider 19 to divide by 4; divider 19a to divide by 5; divider 19b (not shown) to divide by 6; and divider 28 would be set to divide by 20, to obtain a frequency ratio $f_G = 1/60$ of $f_A$, the latter ratio representing the lowest integral frequency ratio or highest rate of coincidence with respect to all output signal frequencies $f_D$, $f_F$, $f_{Fa}$ and $f_{Fb}$, respectively.

From the foregoing description it follows that the additional output signals Fa, Fb, etc. have respective desired presettable frequency ratios with respect to the master clock signal A and are synchronous therewith as well as with respect to each-other and to the previously described clock output signals D, F and G, respectively.

As shown in the timing diagram of FIG. 3 and will follow from the description of a more detailed circuit diagram of FIG. 2, the positive going leading edges of clock signals D, F and any additional clock signals Fa, etc. generated by the circuit in accordance with the preferred embodiment of the invention align periodically with the leading edge of the output signal G from the synchronization frequency divider 28, while all these signals remain synchronized with each-other and with the master clock signal A during operation.

It will be understood by those skilled in the art that the synchronous output signals resulting from the method and circuit of the present invention may be utilized in a wide range of applications requiring synchronous operation of two or more devices. For example, these output signals may be utilized as clock signals fed to two or more serial-to-parallel and parallel-to-serial converters each operating at different data rates, while these converters remain synchronized with respect to each-other as well as to a higher frequency master clock signal. There is an additional advantage when utilizing the method and circuit of the invention that the frequency ratio of one or more signals may be readily changed while the respective output signals remain synchronized. For example the respective symmetrical synchronous signals D, G, Fa, etc. obtained in the preferred embodiment of FIG. 1 are particularly suitable for reclocking data in subsequent flip-flops (not shown) as it is well known in the art.

A more detailed description of the preferred embodiment follows with reference to the schematic circuit diagram of FIG. 2, corresponding to the above described simplified circuit diagram of FIG. 1. To facilitate comparison, corresponding portions and elements in the above-indicated figures are designated by like reference numerals. For the purpose of complete disclosure, the integrated and other circuit components shown in FIG. 2 are designated by respective part numbers commonly used by manufacturers. It is noted, however, that circuit portion 13a of FIG. 1 is deleted from FIG. 2 since it corresponds to portion 13.

With reference to FIG. 2 and the timing diagram of FIG. 3, the master clock signal A received on line 2 is applied via two series inverters 50, 51, utilized to obtain a delay necessary for providing a sufficient pulse width of signal B derived therefrom as follows. The delayed clock signal A' and the master clock signal A are applied to respective inputs of an exclusive OR gate 3 which produces the previously described clock signal B shown in FIG. 3. Thus the gate 3 and inverters 50, 51 correspond to the previously described frequency multiplier 11 of FIG. 1.

The thusly obtained clock signal B is applied via line 4 to the clock signal input of the first presettable frequency divider 5 whose frequency division ratio is preset by programmable switches 6 to divide by 2 as it has been described previously.

Generally, any of the previously mentioned presettable dividers 5, 19 or 28 may be preset to a selected division ratio of an associated programmable switch 6, 20 or 29 by maintaining the respective switch contacts S1 to S4 in closed or open position to obtain a logic low or high signal thereon, respectively, as it is depicted in the Table 1 below:

TABLE 1

| Divide by: | S1 | S2 | S3 | S4 |
|---|---|---|---|---|
| 1 | HI | HI | HI | HI |
| 2 | LO | HI | HI | HI |
| 3 | HI | LO | HI | HI |
| 4 | LO | LO | HI | HI |
| 5 | HI | HI | LO | HI |
| 6 | LO | HI | LO | HI |

To obtain further division ratios by 7, 8, etc., TAB 1 can be extended in the preferred embodiment up to division by 16 for each divider 5, 19 or 28, respectively. To obtain still higher division ratios two or more serially connected dividers may be utilized, as it is well known in the art.

For example to obtain division by two, contact S1 of switch 6 is closed that is grounded, as shown in FIG. 1, while its other contacts S2 to S4 remain open and thus connected to a D.C. voltage source.

The output signal C from frequency divider 5 received on line 8 is shown in FIG. 3. Signal C is applied to a negative NOR gate 7 utilized as an inverter and the inverted signal C resets the frequency divider 5. It is seen from FIG. 3 that signal C on line 8 is synchronous with both signals A and B, respectively. Signal C on line 8 is also applied to the frequency divider 9 which in the preferred embodiment of FIG. 2 is implemented by a D flip-flop 36 coupled to an exclusive OR gate 37 in a manner well known in the art. The D flip-flop 36 receives the previously described signal B on line 4 at its clock input. One input of gate 37 is coupled to receive the output signal of flip-flop 36 and its other input is coupled to receive signal C on line 8. The output signal from frequency divider 9 on line 10 corresponds to the previously described clock output signal D whose frequency is equal to one-half of the frequency of signal C and which is synchronous therewith as it is shown in FIG. 3.

The second presettable frequency divider 19 is preset by programmable switches 20 to have in the preferred embodiment a frequency division ratio 1:5. Divider 19 receives as its clock signal the previously described signal B on line 4 after it has been delayed by delay line 45 to assure that counter 19 receives the preset signal from gate 21 before receiving its clock signal. The second presettable frequency divider 19 is synchronized by the output signal from the previously mentioned NOR gate 21 whose one input is coupled to the terminal count output 25 of divider 19 while its second input receives an inverted and delayed output signal on line 18 from the leading edge detector and pulse conditioner circuit 17 which circuit is described in more detail below.

The third presettable frequency divider 28 receives as its clock signal the previously described signal D provided by frequency divider 9 on line 10. Divider 28 is preset by programmable switches 29 to divide by 5. It is noted with reference to Table 1 that the latter division ratio is obtained on switch 29 by closing contact S3 while contacts S1, S2 and S4 remain open. The terminal count provided by frequency divider 28 on line 14 is shown as signal G in FIG. 3. It is seen that signal G is asymmetrical and that one cycle of signal G corresponds to 20 cycles of signal B, and consequently, to 10 cycles of signal A or C, respectively. The third presettable frequency divider 28 resets via a negative NOR gate 30 utilized as an inverter. The output signal G on line 14 from frequency divider 28 is applied to an input of the leading edge detector and pulse conditioner circuit 17 as follows. Signal G on line 14 is clocked into an input of a D flip-flop 40 by clock signal B on line 4. The output signal from flip-flop 40 is applied to one input of an exclusive OR gate 41 whose second input receives signal G on line 14. The output signal G' from exclusive OR gate 41 on line 31 is a relatively narrow pulse generated at both positive and negative going transitions of the previously described signal G, as shown in FIG. 3. Circuit 17 further comprises a negative AND gate 42 whose one input receives signal G on line 14 and its second input receives signal G' on line 31. The output signal G" on line 18 from negative AND gate 42 corresponds to an inverted signal G' in which the narrow pulses corresponding to the negative transitions of signal G are deleted. The resulting signal G" has a frequency ratio 1:5 with respect to signal D and it is synchronous therewith as well as with signals A, B and C. The output signal G" on line 18 is inverted by inverter 43 and subsequently delayed by delay line 44 and then supplied to one input of negative OR gate 21 whose second input receives the previously described output signal E on line 25 from the second presettable frequency divider 19. The output signal on line 23 from the negative OR gate 21 is utilized to reset divider 19 as it has been described previously with reference to FIG. 1.

It follows from the above description with reference to FIGS. 1 to 3 that the output signal G" from the leading edge detector and pulse conditioner circuit 17 is synchronous with the leading edges of signal G and it is utilized to synchronize the respective second presettable frequency dividers 19, 19a, etc. to obtain respective output signals E, Ea, etc. therefrom which signals are also synchronous with the leading edges of output signal G obtained from the third synchronizing presettable frequency divider 28. As it is seen from FIG. 3, signal G" has a frequency ratio of 1:4 with respect to signal E. Since signal G" is synchronous with signal B which in turn is synchronous with both signals C and D as described previously, signals E, Ea, etc. obtained from the respective second presettable frequency dividers 19, 19a, etc. are also synchronous with signal D. Signal G" on line 18 also presets frequency divider 26 which is preferably implemented by a D flip-flop 38 and exclusive OR gate 39 which are coupled in a manner similar to that previously described with respect to divider 9. The previously described delayed clock signal from delay line 45 is applied to the clock input of flip-flop 38. One input of exclusive OR gate 39 receives signal E on line 25 and its other input receives the output signal F from flip-flop 38 on line 27. The output signal from exclusive OR gate 39 is in turn utilized as an input signal of flip-flop 38. Flip-flop 38 is periodically preset by signal G" on line 18 to obtain a desired phase of output signal F therefrom. It is seen from FIG. 3 that the frequency ratio of signal F is 1:2 with respect to signal E. It follows from the previous description that the resulting output signal F as well as additional output signals Fa, etc. are synchronous with respective signals E, Ea, etc. and since these latter signals are synchronous with the previously described respective signals A, B, C, D and G signals F, Fa, etc. are also synchronous therewith.

While a preferred embodiment of the invention has been described above and illustrated in the drawings, it will be appreciated that a number of alternatives and modifications may be made which will fall within the scope of the appended claims.

What is claimed is:

1. A circuit for providing synchronous clock signals, each having a selected integral frequency division ratio with respect to a master clock signal frequency, respectively, comprising:

a first programmable ratio frequency divider means having an input for receiving said master clock signal and having an output for providing a first clock signal whose frequency is preset by said first divider means to have an integral frequency division ratio with respect to said master clock signal frequency;

at least one second programmable ratio frequency divider means each having an input for receiving said master clock signal and an output for providing a second clock signal whose frequency is preset by said second divider means to have an integral frequency division ratio with respect to said master clock signal frequency;

a third programmable ratio frequency divider means having an input for receiving said first clock signal and having an output for providing a third clock signal whose frequency is preset by said third divider means to have respective integral frequency division ratios with respect to said first and all said second clock signals, respectively; and a synchonizing means having a first input for receiving said master clock signal and a second input for receiving said third clock signal and providing a synchronizing signal having a frequency corresponding to that of said third clock signal and synchronous therewith, said synchronizing signal being coupled to periodically preset each said second programmable ratio frequency divider means to obtain synchronization of said respective second clock signals with both said first and third clock signals, respectively.

2. The circuit of claim 1 further comprising:

a frequency multiplier means having an input coupled to receive said master clock signal and to multiply its frequency by a selected integral multiplication factor and having an output coupled to apply a frequency multiplied signal as said master clock signal to said respective inputs of said first and all said second programmable ratio frequency divider means;

a fourth frequency divider means having an input coupled to the output of said first programmable ratio frequency divider means;

a fifth frequency divider means having an input coupled to the output of said second programmable ratio frequency divider means, said fourth and fifth frequency divider means each having a frequency division ratio selected to compensate for said multiplication factor of said frequency multiplier means; and wherein said first signal received by said third programmable ratio frequency divider means is provided as an output signal of said fourth frequency divider means.

3. The circuit of claim 1 wherein said first, second and third programmable ratio frequency divider means each comprises a presettable binary counter means, respectively, and a means for presetting the count provided by each said counter means to obtain respective desired frequency division ratios of each said frequency divider means.

4. The circuit of claim 3 wherein said means for presetting said count are programmable switches.

5. The circuit of claim 1 wherein said synchronizing means comprises a latch means and logic gates and wherein said synchronizing output signal has a pulse width shorter than one half period of the master clock signal and it is provided in response to said third clock signal and synchronously therewith.

6. A circuit for providing synchronous symmetrical clock signals, each having a selected integral frequency division ratio with respect to a master clock signal frequency, respectively, comprising:

a frequency multiplier means having an input coupled to receive said master clock signal and to multiply the frequency thereof by a selected integral multiplication factor;

a first presettable counter means having an input coupled to receive said frequency multiplied master clock signal and having an output coupled to provide a first output signal having an integral frequency division ratio with respect to said frequency multiplied master clock signal frequency which division ratio is preset by said first counter means;

at least one second presettable counter means having an input coupled to receive said frequency multiplied master clock signal and having an output coupled to provide a second output signal having an integral frequency division ratio with respect to said frequency multiplied master clock signal frequency which division ratio is preset by said second counter means;

a first and at least one second frequency divider means each having an input coupled to a respective output of one said first or second presettable counter means, respectively, each of said frequency divider means having a division ratio compensating for said multiplication factor of said frequency multiplier means, each said first and second frequency divider means having an output respectively providing a first or second symmetrical output signal having a respective frequency division ratio with respect to said master clock signal frequency as preset by said first or second presettable counter means, respectively; and a third presettable counter means having an input coupled to said output of said first frequency divider means to receive said first output signal therefrom and having an output coupled to provide a third output signal, said third presettable counter means being preset to provide a count representing respective integral frequency division ratios of said third output signal to said first and all said second output signals, respectively; and a synchronizing means having a first input coupled to receive said output signal of said frequency multiplier means and a second input coupled to receive said third output signal and providing a synchronizing output signal having a frequency corresponding to the frequency of said third output signal and synchronous therewith, said synchronizing output signal being coupled to periodically preset said second presettable counter means to obtain synchronization of said second output signals with both said first and third output signals, respectively.

7. The circuit of claim 6 further comprising respective programmable switches each coupled to one said first, second and third presettable counter means to preset said integral frequency division ratio thereof.

8. A method for providing synchronous clock signals, each having a selected integral frequency ratio with respect to a master clock signal frequency, comprising the steps of:

providing a first clock signal having a presettable integral frequency division ratio with respect to said master clock signal frequency;

providing at least one second clock signal each having a respective presettable integral frequency division ratio with respect to said master clock signal frequency;

providing a third clock signal having a presettable integral frequency ratio with respect to said first clock signal frequency and presetting said frequency ratio of said third clock signal to obtain respective integral frequency ratios with respect to said first and all said second clock signal frequencies, respectively; and synchronously deriving from said third clock signal and said master clock signal a synchronizing clock signal having a frequency corresponding to said third clock signal and applying said derived clock signal to synchronize said second clock signal with said first and third clock signals respectively.

9. The method of claim 8 for providing symmetrical synchronous clock signals, further comprising the step of:

multiplying the frequency of said master clock signal by a selected integral multiplication factor prior to the respective steps of providing said first and at least one second clock signal; and dividing the frequency of said first and second clock signal by a division ratio compensating for said selected multiplication factor.

* * * * *